United States Patent [19]

Moog

[11] 4,117,413

[45] Sep. 26, 1978

[54] AMPLIFIER WITH MULTIFILTER

[75] Inventor: Robert A. Moog, East Aurora, N.Y.

[73] Assignee: Norlin Music, Inc., Lincolnwood, Ill.

[21] Appl. No.: 808,494

[22] Filed: Jun. 21, 1977

[51] Int. Cl.² .............................................. H03F 3/68
[52] U.S. Cl. ..................................... 330/126; 84/1.11; 84/1.22; 330/51; 330/151
[58] Field of Search ................. 330/51, 107, 109, 126, 330/151, 295, 303, 306; 84/1.11, 1.16, 1.19, 1.22, 1.24, DIG. 9

[56] References Cited

U.S. PATENT DOCUMENTS

| | | | |
|---|---|---|---|
| 2,709,206 | 5/1955 | Ferguson | 330/126 X |
| 3,493,669 | 2/1970 | Elbrecht et al. | 84/1.11 UX |
| 3,566,294 | 2/1971 | Takahashi | 330/126 |
| 3,750,044 | 7/1973 | Stanley | 330/126 |
| 3,752,928 | 8/1973 | Flickinger | 330/126 X |

Primary Examiner—James B. Mullins
Attorney, Agent, or Firm—Ronald J. Kransdorf; Jack Kail

[57] ABSTRACT

In an audio amplifier for amplifying signals from an electric guitar or the like having a conventional tone control circuit for selectively emphasizing input signals in the bass, middle and treble frequency ranges of the instrument, a multifilter circuit for emphasizing input signals with frequencies in selected, relatively narrow, frequency bands in the upper portion of the frequency spectrum to minimize aural fatigue. The multifilter circuit comprises a plurality of parallel connected, two-pole, resonant filter sections with different, relatively narrow, resonant frequency bands separated from one another by an amount on the order of ¼ octave and forms a signal path that supplements the signal path provided by the conventional tone control circuit. The signals produced on the output of the tone control circuit are mixed with the multifilter output signals. Potentiometers are provided to vary the amplitude of the output signals of the entire multifilter circuit or selected ones of the filter sections thereof. Both the amplitude and phase frequency response of the multifilter are characterized by a plurality of successive peaks and dips, such that as the musician plays different notes, certain number of harmonics are emphasized in some notes, while other harmonics are emphasized in other notes with respect to amplitude while variations in the pitch or frequency of the input signal result in the phases of the individual harmonics to be rapidly shifted which causes minute shifts in the pitch of the individual harmonics produced on the output.

13 Claims, 5 Drawing Figures

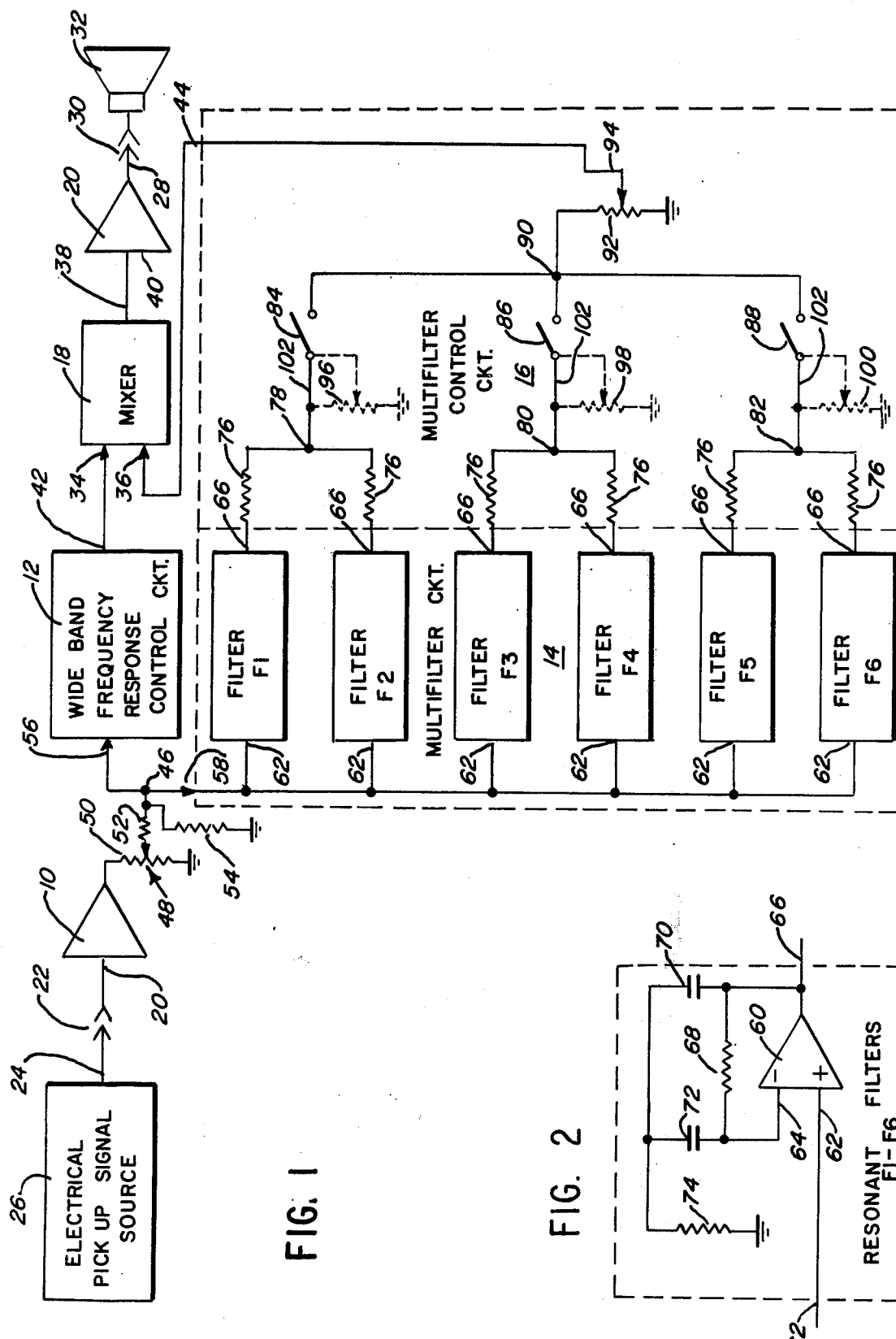

AMPLIFIER WITH MULTIFILTER

BACKGROUND OF THE INVENTION

This invention relates generally to audio amplifiers for electric guitars or the like and, more particularly, to a filter circuit for such an amplifier for selectively altering the amplitude and phase signals within selected, narrow frequency bands of the signal being amplified.

In conventional guitar amplifiers, the input signal from the electric pickup of the guitar is applied to a preamplifier which acts as an input buffer. Thereafter, the preamplified signal is coupled to a volume control potentiometer, and the volume controlled signal from the potentiometer is then coupled to three filters respectively responsive to bass, middle and treble, manual controls for selectively varying the frequency response of the amplifier. These controls enable the operator of the amplifier to selectively emphasize at least one of these three ranges of the frequency spectrum of the musical instrument.

However, the ear is most sensitive to audible signals having a frequency in the range from 1 kHz to 4 kHz. Sustained high energy in any wide segment of this band results in what is commonly referred to as aural fatigue. This is due to the subjective hearing experience being more responsive to changes in sound than to absolute levels. The problem of aural fatigue is not solved by the conventional bass, middle and treble frequency response controls, for each control emphasizes its associated wide band range of the frequency spectrum. There is, therefore, a need in guitar amplifiers and the like for a circuit which will eliminate or reduce this aural fatigue problem.

SUMMARY OF THE INVENTION

The principal object of the present invention is to provide an audio amplifier for electric guitars or the like having means for artificially introducing variations in the amplified signal such that aural fatigue is reduced. In keeping with this objective, a multifilter circuit is provided which emphasizes only those input signals having frequencies which fall within a plurality of different, preselected, narrow frequency bandwidths which are distributed throughout the high portion of the frequency spectrum of the instrument. The boost or emphasis given to these certain narrow portions of the high portion of the frequency spectrum results in certain ones of the harmonics of some notes being played to be emphasized, while different harmonics are emphasized of other notes. The net effect of this selected emphasis is a complex change in spectral density of the guitar amplifier's output as different notes are played. This is perceived by a listener as a "bright tone color" that has a feeling of "liveliness" and does not fatigue the ear.

Another advantageous feature of the present invention in keeping with the objective noted above is provision of such a multifilter in which the phase shift imparted to the signals by the multifilter varies substantially with relatively small changes in the frequency of the signal, for it has been discovered that such a change in phase shift with frequency likewise reduces aural fatigue. The changes in phase shift with frequency results in the phases of the individual harmonics to be rapidly shifted as a musician continuously varies pitch as occurs during solo playing. This causes minute shifts in the pitch of the individual harmonics and thereby imparts a warmth and aural appeal to the sound that is not achievable with conventional tone control circuits.

A further feature of the present invention is provision of an audio amplifier having such a multifilter and including means for selectively mixing the output signal from the multifilter with the output signal of a conventional tone control circuit.

BRIEF DESCRIPTION OF THE DRAWING

The foregoing features and advantages of the present invention will be made more apparent and further features and advantages will be disclosed in the description of the preferred embodiment given in conjunction with the several views of the drawing, in which:

FIG. 1 is a schematic diagram, partially in block form, of one embodiment of the amplifier with multifilter of the present invention;

FIG. 2 is a schematic diagram of a representative one of the component, resonant filter sections of the multifilter shown in functional block form in FIG. 1;

DESCRIPTION OF THE PREFERRED EMBODIMENT

Figure 3A:
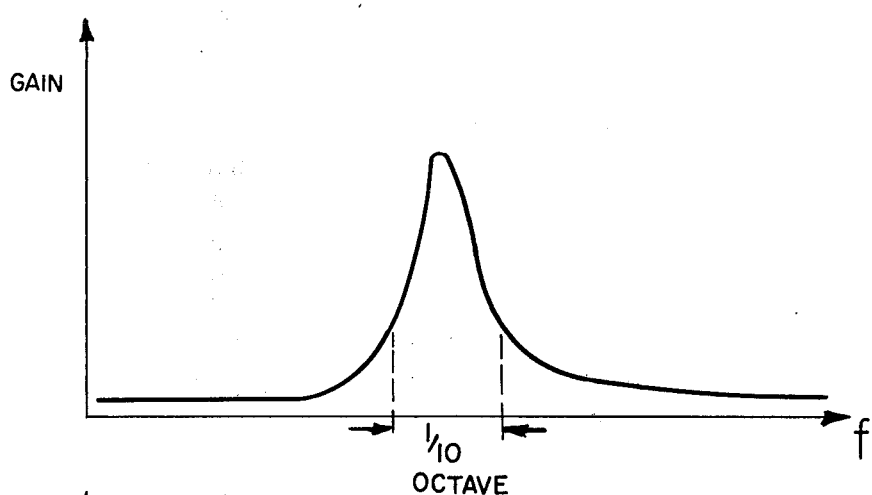
FIG. 3a is an illustrative frequency response curve of the resonant filter section shown in FIG. 2.

Referring to FIG. 1 of the drawing, one embodiment of the present invention is seen to include a preamplifier 10, a conventional wide band, frequency response control circuit 12, a multifilter circuit 14, a multifilter control circuit 16, a mixer circuit 18, and an output amplifier 20. The preamplifier 10 receives signals at an input 20 coupled with one connector of a mating connector assembly 22 for detachable connection with an output 24 of an electrical pickup signal source 26. The embodiment of FIG. 1 is particularly adapted for amplifying signals from an electric guitar and source 26 may be considered as an electric guitar pickup. It should, however, be understood that the amplifier can be employed with other sources of electrical audio signals. The output amplifier 20 which may have more than one stage produces filtered and amplified signals on its output 28 which is coupled with a connector of a mating connector assembly 30 for detachable connection with a suitable speaker system 32. Neither the speaker system 32 nor the electrical pickup signal source 26 form part of the present invention. They are conventional and will not be described any further, except to say that they must be chosen in accordance with the power and other characteristics of the amplifier.

The mixer 18, which may also be conventional, mixes together the signals provided at its two inputs 34 and 36 and produces a mixed or composite signal on its output 38 consisting of a combination of the two input signals. The composite signal is coupled to the input 40 of the amplifier 20, amplified and converted to sound by speaker system 32.

The signal applied to input 34 of mixer 18 is taken from an output 42 of a wide band frequency response control circuit 12, and the signal applied to input 36 is taken from an output 44 of multifilter control circuit 16. Both the wide band frequency response control circuit 12 and the multifilter circuit 14 receive the identical audio input signal from an output 46 of a level or volume control circuit 48. Level control circuit 48 comprises a potentiometer resistor 50 connected between the output of preamplifier 10 and ground and a pair of limiting resistors 52 and 54. The audio input signal at terminal 46 is applied to an input 56 of a wide band frequency response control circuit 12 and to an input 58 of multifilter circuit 14.

The wide band frequency response control circuit 12 is conventional. Briefly, the control circuit 12 includes one or more filters which emphasize the amplitudes of selected wide band segments of the frequency spectrum of the input signal. Such control circuits are normally associated with control knobs found on amplifiers which are labeled BASS, MIDRANGE, and TREBLE and provided to enable an operator to selectively emphasize signals in the low, middle and high frequency ranges of the frequency spectrum.

The multifilter circuit 14 comprises a plurality of two-pole, narrow band, resonant filter sections respectively labeled F1, F2, F3, F4, F5 and F6. While six such filter sections or filters have been shown in the preferred embodiment because satisfactory results in a guitar application have been obtained with this number, good results have also been obtained with eight such filters. It should therefore be appreciated that more or fewer filter sections could be used in the multifilter circuit, as desired.

Each of the filter sections F1-F6 has an identical circuit configuration which is shown in FIG. 2. Referring to FIG. 2, each of the filter sections is seen to include an operational amplifier 60 with a normal input 62 to which input signals are applied, an inverting input 64 and an output 66 at which the filtered signals are produced. A two-pole feedback circuit between the output 66 and inverting input 64 comprises a resistor 68, a pair of capacitors 70 and 72 and a resistor 74. Each of the filter sections F1-F6 has a gain or amplitude versus frequency curve substantially as shown in FIG. 3a. The bandwidth of the filter section is relatively narrow, preferably on the order of 1/10 octave. The peak response, of course, occurs at the resonant frequency of the section.

All of the filter sections are connected in parallel between the input 20 and the output 28 of the amplifier. The input 62 of each filter section is directly connected to input 58 of multifilter circuit 14 which, in turn, is connected through level control circuit 48 and preamplifier 10 to input 20. The output 66 of all filter sections F1-F6 are commonly connected through multifilter control circuit 16 to output 44.

The multifilter control circuit is provided to enable an operator of the amplifier to selectively adjust or control the level of signals applied to mixer 18 from selected subgroups of filters F1-F6. As seen in FIG. 1, the output 66 of each filter F1-F6 is connected to a resistor 76. The resistors 76 of filters F1 and F2 are connected to a common junction 78 which groups the two filters together for common control by subsequent circuitry associated with junction 78. Filters F3 and F4 are likewise grouped together by connecting their resistors 76 to a common junction 80, and filters F5 and F6 are grouped together by connecting their output resistors 76 to a common junction 82.

Junctions 78, 80 and 82 are respectively connected to single-pole, single-throw switches 84, 86 and 88, respectively. With all switches 84, 86 and 88 in a closed position, opposite to that shown, all resistors 76 are commonly connected to a junction 90. Junction 90, in turn, is connected to one side of a potentiometer resistor 92, the other side of which is connected to ground. A wiper 94 of potentiometer 92 is connected directly to output 44 of multifilter control circuit 16 which, in turn, is coupled to input 36 of mixer 18. Thus, with all switches 84-88 closed, the operator may control the level of the output signals from all filters F1-F6 together by controlling the position of wiper 94. Alternately, or supplemental to the level control provided by potentiometer 92, the filter subgroups respectively associated with junction 78, 80 and 82 can have their output levels individually controlled by means of potentiometers 96, 98 and 100 respectively associated therewith. For individual level control by potentiometers 96, 98 and 100, the direct connection between junctions 78, 80 and 82 and switches 84, 86 and 88, respectively, provided by lines 102 are eliminated. Switches 84, 86 and 88, of course, also provide a means for disconnecting the sub-group of filters associated therewith from the output 44 of multifilter control circuit 16. If desired, a potentiometer such as potentiometers 96, 98 and 100, could be provided for each of filters F1-F6 so that the output signal amplitude of each filter section could be individually controlled. Likewise, switches or level control potentiometers could be provided between input 58 and the inputs 62 of one or more of filters F1-F6 to enable adjustment of the amount of signal fed to individual or specific groups of the filter sections.

Figure 3B:
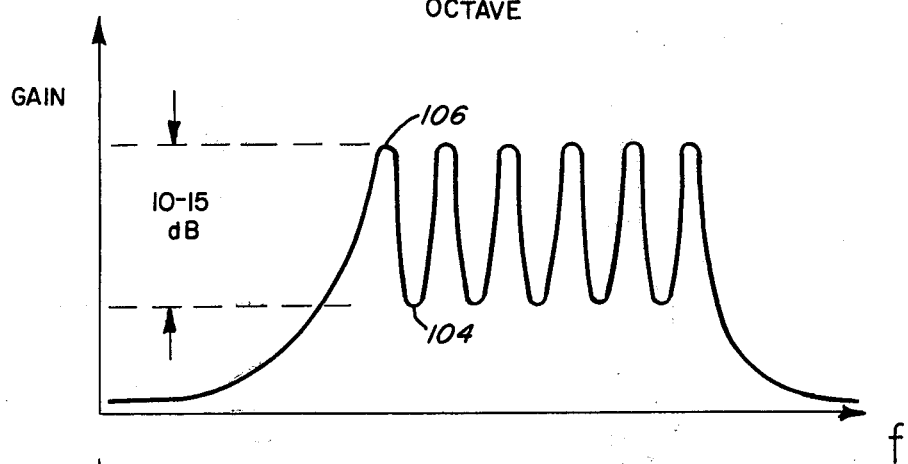
FIG. 3b is an illustrative gain-frequency response curve of the multifilter shown in FIG. 1.
Figure 3C:
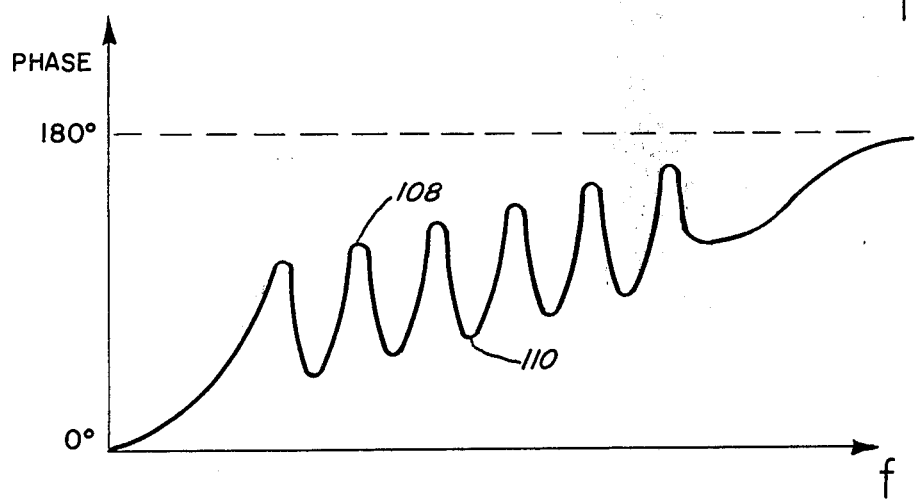
FIG. 3c is an illustrative phase-frequency response curve of the multifilter shown in FIG. 1.

Referring to FIGS. 3b and 3c, the gain and phase shift versus frequency of a multifilter having six resonant filters is shown. In FIG. 3b, dips or minimum levels 104 are located between the peaks 106. As seen in FIG. 3c, corresponding peaks 108 and dips 110 are present in the phase shift curve. The ratio of the peak gain to the minimum gain is chosen by selecting the Q of each of the filter sections. The location of the peaks with respect to frequency is directly related to the resonant frequencies of the resonant filters. Subjectively, the best or most pleasing aural results have been obtained when the resonant frequencies of the filters F1-F6 are separated in frequency by an amount between ½ octave and 1/6 octave apart, with a separation of ¼ octave being preferred, and when the Q's of the filter sections are selected to give a maximum gain to minimum gain ratio of between 10 and 15 db.

A circuit was constructed in accordance with the schematic shown in FIGS. 1 and 2 in which the resonant frequencies of filter sections F1-F6 were chosen to be 700, 960, 1333, 1839, 2539 and 3500 Hz, respectively. To achieve these resonant frequencies, the individual components for the resonant filters F1-F6 had the following values:

| COMPONENT | FILTER SECTION | | | | | | UNIT |
|---|---|---|---|---|---|---|---|
| | F1 | F2 | F3 | F4 | F5 | F6 | |
| Resistor 68 | 56 | 43 | 30 | 47 | 36 | 24 | kohms |
| Capacitor 70 | 0.1 | 0.1 | 0.1 | .047 | .047 | .047 | mfd |
| Capacitor 72 | 0.1 | 0.1 | 0.1 | .047 | .047 | .047 | mfd |
| Resistor 74 | 82 | 62 | 43 | 68 | 47 | 36 | ohms |

I claim:
1. In an audio amplifier for producing amplified signals on an output thereof corresponding to audio signals applied to an input thereof a multifilter circuit, comprising:
 a plurality of resonant filters each having a resonant frequency in the upper portion of the audio frequency spectrum and a relatively narrow bandwidth, the resonant frequencies of each of the reso- nant filters being separated from each other by an amount substantially equal to a value between ½ and 1/6 octave for defining a gain versus frequency response characterized by a plurality of relatively narrow band alternate peaks and dips and a phase shift versus frequency response characterized by a plurality of relatively narrow band alternate peaks and dips, the Q's of the resonant filters being selected such that the peaks and dips of the gain versus frequency response exhibit a relatively large ratio;

means for connecting the plurality of resonant filters in parallel with one another between an input terminal and an output terminal thereof;

means connected with the input of the audio amplifier for applying the audio input signals to the input terminal, said plurality of resonant filters producing a filtered audio signal on the output terminal; and means connected for applying the filtered audio signals to the audio amplifier output.

2. The audio amplifier of claim 1 in which each of the resonant filters has two poles.

3. The audio amplifier of claim 2 in which each of the resonant filters has a resonant frequency band of a width on the order of 1/10 octave.

4. The audio amplifier of claim 3 in which the resonant frequency band is substantially equal to 1/10 octave.

5. The audio amplifier of claim 1 in which the difference between the resonant frequency of each filter and that of the filter closest to it in terms of resonant frequency is substantially equal to ¼ octave.

6. The audio amplifier of claim 1 in which said ratio is substantially equal to a value between 10-15 db.

7. The audio amplifier of claim 1, including
tone control means having an input for receiving the audio input signals and an output, said control means providing emphasis to input signals having frequencies in at least one of the bass, mid-range and treble frequency ranges of the input signal, said tone control means providing selectively emphasized audio signals on its output, and means for mixing the signals provided on the output of the tone control means with the signals produced by the plurality of resonant filters.

8. The audio amplifier of claim 7 including means for manually adjusting the amplitude of the signal produced by the output of the plurality of resonant filters before being mixed with the signals produced on the output of the tone control means.

9. The audio amplifier of claim 1 including means for summing the output signals of less than all of the resonant filters, and means for selectively adjusting the relative amplitude of the summed signals relative to the amplitude of the signals produced on the outputs of the remaining filters.

10. The audio amplifier of claim 1 including switch means for selectively disconnecting at least one of the resonant filters from the other resonant filters.

11. The audio amplifier of claim 1 in which said plurality of resonant filters comprise a plural number of resonant filters which number is on the order of six.

12. The audio amplifier of claim 11 in which said plural number is at least as great as six.

13. The audio amplifier of claim 12 in which said plural number is approximately eight.

* * * * *